(12) United States Patent
Weinstein (10) Patent No.: US 12,121,855 B1
(45) Date of Patent: Oct. 22, 2024

(54) CATALYTIC ABATEMENT SYSTEM FOR SEMICONDUCTOR MANUFACTURING PROCESS

(71) Applicant: GlobalFoundries U.S. Inc., Malta, NY (US)

(72) Inventor: Justin M. Weinstein, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/607,331

(22) Filed: Mar. 15, 2024

(51) Int. Cl.
| | | |
|---|---|---|
| *B01D 53/75* | (2006.01) | |
| *B01D 53/04* | (2006.01) | |
| *B01D 53/26* | (2006.01) | |
| *B01D 53/34* | (2006.01) | |
| *B01D 53/81* | (2006.01) | |
| *B01D 53/86* | (2006.01) | |
| *C23C 16/44* | (2006.01) | |

(52) U.S. Cl.
CPC ......... *B01D 53/75* (2013.01); *B01D 53/0438* (2013.01); *B01D 53/261* (2013.01); *B01D 53/346* (2013.01); *B01D 53/81* (2013.01); *B01D 53/8631* (2013.01); *B01D 53/8696* (2013.01); *C23C 16/4412* (2013.01); *B01D 2251/602* (2013.01); *B01D 2253/106* (2013.01); *B01D 2255/1021* (2013.01); *B01D 2255/1025* (2013.01); *B01D 2255/9155* (2013.01); *B01D 2257/402* (2013.01); *B01D 2257/553* (2013.01); *B01D 2257/80* (2013.01); *B01D 2258/0216* (2013.01)

(58) Field of Classification Search
CPC .. B01D 53/75; B01D 53/0438; B01D 53/261; B01D 53/346; B01D 53/81; B01D 53/8631; B01D 53/8696; B01D 2255/9155; B01D 2257/553; B01D 2258/0216; C23C 16/4412
USPC ....................................................... 423/239.1
See application file for complete search history.

(56) References Cited

U.S. PATENT DOCUMENTS

| | | | |
|---|---|---|---|
| 6,491,884 B1 * | 12/2002 | Faller | B01D 53/02 96/108 |
| 6,613,293 B2 | 9/2003 | Dornseiffer et al. | |
| 8,512,658 B2 | 8/2013 | Eckhoff et al. | |

FOREIGN PATENT DOCUMENTS

JP   3703538 B2 * 10/2005

OTHER PUBLICATIONS

JP-3703538-B2 English translation (Year: 2005).*

(Continued)

*Primary Examiner* — Anita Nassiri-Motlagh
(74) *Attorney, Agent, or Firm* — Francois Pagette; Hoffman Warnick, LLC (57) ABSTRACT

A system to abate an emission stream from a semiconductor manufacturing process is disclosed. The system includes a plurality of sections configured to pass an emission stream therethrough. The sections include a metal oxide media section to remove a hydride from the emission stream; a desiccate media section downstream to the metal oxide media section to remove moisture from the emission stream; and a catalytic media section downstream to the desiccate media section to remove a nitrogen oxide ($NO_x$) from the emission stream. The abatement system provides carbon-free abatement of nitrogen oxide and hydride(s). The abatement system has significantly lower cost to manufacture and operate.

20 Claims, 3 Drawing Sheets

(56) References Cited

OTHER PUBLICATIONS

U.S. Appl. No. 18/479,346 entitled "Retrofittable Dry Media Abatement Reactor" filed Oct. 2, 2023, 22 pages.
U.S. Appl. No. 18/484,497 entitled "Carbon Dioxide and Nitrogen Oxides Removal System for Point of Use Abatement" filed Oct. 11, 2023, 25 pages.
U.S. Appl. No. 18/533,316 entitled "Flexible Fuel System for Combustion Abatement" filed Dec. 8, 2023, 42 pages.

* cited by examiner

CATALYTIC ABATEMENT SYSTEM FOR SEMICONDUCTOR MANUFACTURING PROCESS

BACKGROUND

The present disclosure relates generally to gas abatement systems and, more particularly, to a system for abatement of an emission stream from a semiconductor manufacturing process.

Semiconductor manufacturing processes often yield emissions having potentially hazardous and toxic gas species. High temperature oxide (HTO) processes are one type of semiconductor manufacturing process that requires nitrous oxide ($N_2O$) and may use flammable gases such as silane ($SiH_4$) and disilane ($Si_2H_6$). An abatement system is typically coupled to a semiconductor manufacturing process to remove, or substantially remove, gas species from an emission stream output from the manufacturing process. Current abatement systems are inefficient at removing the nitrous oxide from an emissions stream. They also typically use a combustion burner that requires burning of fossil fuels, which reduces at least some of the pollution reduction achieved. Current systems also use a wet scrubber that disadvantageously uses large amounts of water and do not absorb nitrous oxide.

SUMMARY

All aspects, examples and features mentioned below can be combined in any technically possible way.

An aspect of the disclosure provides an abatement system for a semiconductor manufacturing process, the system comprising: a plurality of sections configured to pass an emission stream from the semiconductor manufacturing process therethrough, the plurality of sections including: a metal oxide media section to remove a hydride from the emission stream; a desiccate media section downstream to the metal oxide media section to remove moisture from the emission stream; and a catalytic media section downstream to the desiccate media section to remove a nitrogen oxide ($NO_x$) from the emission stream.

Another aspect of the disclosure provides an abatement system for a chemical vapor deposition (CVD) or atomic layer deposition (ALD) chamber for a semiconductor manufacturing process, the abatement system comprising: a plurality of sections configured to pass an emission stream from the semiconductor manufacturing process therethrough, the plurality of sections including: a metal oxide media section to remove a hydride from the emission stream; a desiccate media section downstream to the metal oxide media section to remove moisture from the emission stream; and a catalytic media section downstream to the desiccate media section to remove a nitrogen oxide ($NO_x$) from the emission stream; and a vacuum pump coupled to the plurality of sections and configured to transmit the emission stream from the semiconductor manufacturing process through the plurality of sections.

Another aspect of the disclosure provides a method, comprising: transmitting an emission stream from a semiconductor manufacturing process sequentially through a plurality of abatement sections including: a metal oxide media section to remove a hydride from the emission stream; a desiccate media section downstream to the metal oxide media section to remove moisture from the emission stream; and a catalytic media section downstream to the desiccate media section to remove a nitrogen oxide ($NO_x$) from the emission stream; and heating the catalytic media section during the transmitting.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an abatement system for a semiconductor manufacturing process. The system includes a plurality of sections configured to pass an emission stream therethrough. The plurality of sections includes a metal oxide media section to remove a hydride from the emission stream; a desiccate media section downstream to the metal oxide media section to remove moisture from the emission stream; and a catalytic media section downstream to the desiccate media section to remove a nitrogen oxide ($NO_x$) from the emission stream. The abatement system thus provides carbon-free abatement of nitrogen oxide(s) and hydride(s). The abatement system has significantly lower cost to operate compared to conventional burner and wet scrubbing systems that include a combustion burner to burn fossil fuels, e.g., natural gas, and a wet scrubber that uses large amounts of water. The abatement system also has lower manufacturing costs and can be incorporated with other existing abatements systems for other semiconductor manufacturing processes, saving floor space.

Figure 1:
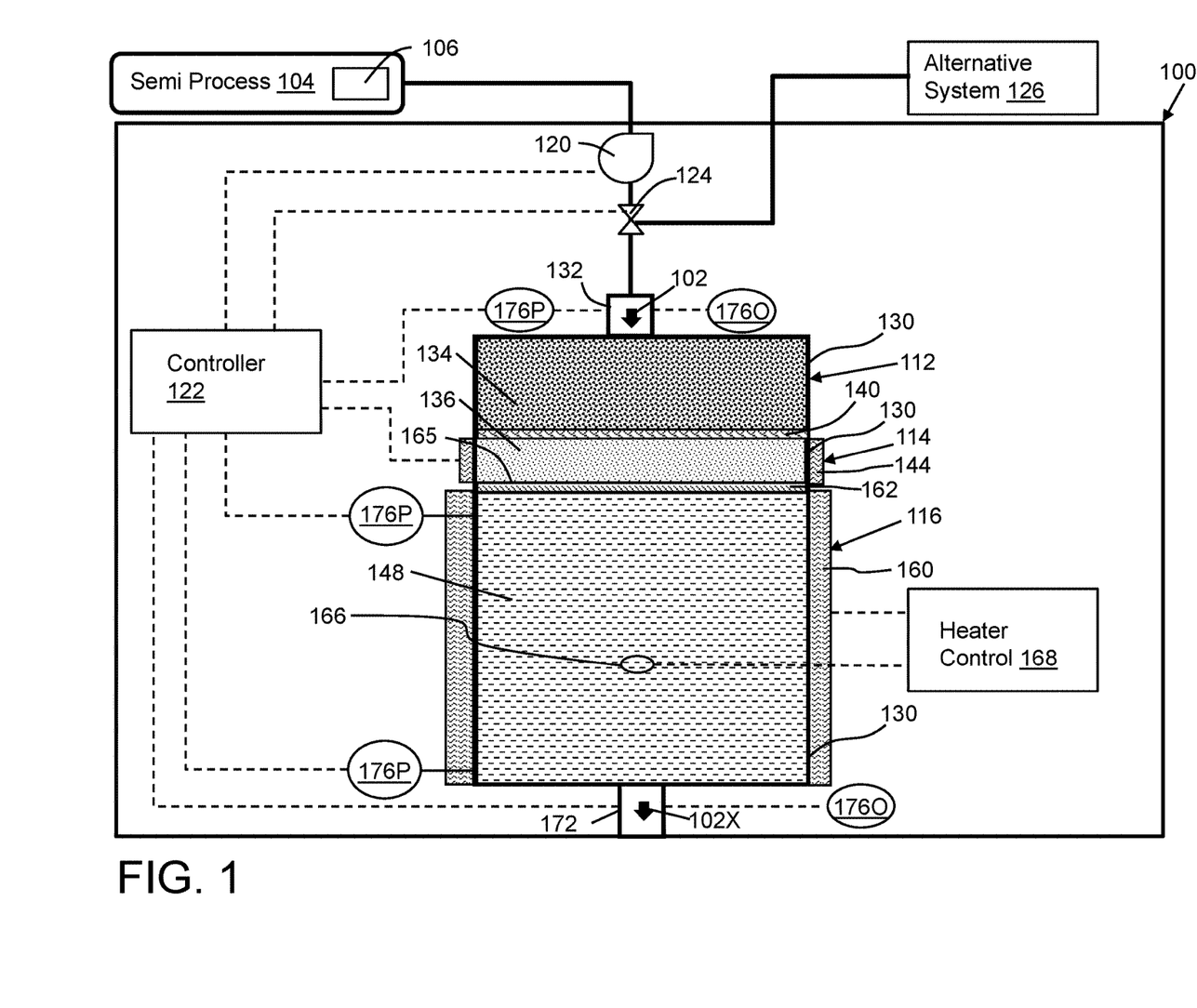
FIG. 1 shows a block diagram of a system for abatement of an emission stream from a semiconductor manufacturing process, according to embodiments of the disclosure.

FIG. 1 shows a block diagram of an abatement system 100 to abate an emission stream 102, according to embodiments of the disclosure. System 100 includes or is configured to operate with a semiconductor manufacturing process 104 ("Semi Process 104" in FIG. 1). One form of semiconductor manufacturing process 104 may include a high temperature oxide (HTO) process that includes a step or series of steps to form an oxide, such as silicon oxide ($SiO_2$), as part of fabricating, processing, and/or otherwise modifying a semiconductor material, integrated circuit chip, etc. (Silicon oxide ($SiO_2$) is also known as silicon dioxide or silica). The HTO process uses a chemical vapor deposition (CVD) chamber or atomic layer deposition (ALD) chamber, both labeled 106. While a variety of CVD or ALD chambers 106 (hereafter "CVD/ALD chamber 106") may be used, one example CVD chamber may include a rapid thermal CVD chamber (RTCVD), which is oftentimes used for HTO processes. This CVD or ALD process could apply to both single wafer processing or batched processing of multiple wafers at once. Hence, as will be described, abatement system 100 may be configured for emission stream 102 from CVD/ALD chamber 106 for semiconductor manufacturing process 104.

The HTO process chemistry uses nitrogen oxide ($NO_x$) and perhaps certain flammable gas hydrides such as silane ($SiH_4$). Consequently, semiconductor manufacturing process 104 may yield an emission stream 102 including a hazardous and toxic byproduct, for example, any nitrogen oxide ($NO_x$) such as nitrous oxide ($N_2O$) and hydrides such as silane ($SiH_4$) or disilane ($Si_2H_6$). Abatement system 100 may transmit emission stream 102 away from semiconductor manufacturing process 104, and through a plurality of sections 112, 114, 116 configured to remove hazardous and toxic gas species from emission stream 102.

Abatement system 100 (hereafter "system 100") may include a vacuum pump 120 coupled to semiconductor manufacturing process 104. Where emission stream 102 does not otherwise have the necessary motive force to transmit through system 100, vacuum pump 120 may forcibly transmit emission stream 102 from semiconductor manufacturing process 104 through plurality of sections 112, 114, 116 for abatement. That is, vacuum pump 120 is coupled to semiconductor manufacturing process 104 and sections 112, 114, 116 and is configured to transmit emission stream 102 from semiconductor manufacturing process 104 through plurality of sections 112, 114, 116. As will be described herein, vacuum pump 120 may be controlled by a controller 122 that controls one or more abatements systems and/or other semiconductor manufacturing equipment within a semiconductor manufacturing facility. While vacuum pump 120 is shown upstream of plurality of sections 112, 114, 116 to push emission stream 102 therethrough, it is understood that it may be alternatively positioned downstream to draw emission stream 102 therethrough.

System 100 may also include a bypass valve 124 operative to direct emission stream 102 to an alternative abatement system 126 ("Alternative System 126" in FIG. 1). Alternative abatement system 126 may include any now known or later developed abatement system distinct from system 100. In certain implementations, alternative abatement system 126 may be configured to abate emission stream 102 in the case of a fault in system 100, or where emission stream 102, perhaps temporarily, includes gases that system 100 is incapable of abating. Alternatively, alternative abatement system 126 may include an exhaust to atmosphere. The operation of bypass valve 124 will be described in greater detail herein.

The plurality of sections 112, 114, 116 (hereafter "sections" for brevity) include any form of one or more housings 130 capable of containing the desired abatement material and/or structure therein and direct emission stream 102 therethrough, e.g., metal enclosures, tubes, conduits, chambers, etc. Each housing 130 has an input end and an output end (not labeled for clarity). For illustration purposes, each section is shown including a respective housing 130; however, this is not necessary in all cases as some sections can share a housing. Housing(s) 130 may be configured in any manner to couple to one another and/or to couple any form of upstream or downstream conduits for transmitting emission stream 102 therethrough in a sealed manner. Housing(s) 130 may be detachable in any manner to allow for maintenance.

The sections include a metal oxide media section 112 to remove a hydride from emission stream 102. CVD/ALD chamber 106 for semiconductor manufacturing process 104 is upstream of metal oxide media section 112. System 100 may include an exhaust input 132 from semiconductor manufacturing process 104 to metal oxide media section 112. Exhaust input 132 may be any form of fluidic coupling, such as but not limited to a conduit. Metal oxide media section 112 includes a metal oxide media 134 therein. The term "metal oxide media" as used herein refers to a compound, or combination of compounds, capable of destroying hydride gas in emission stream 102, such as a copper-based compound, e.g., copper oxide (CuO), copper carbonate ($CuCO_3$); zinc oxide (ZnO); aluminum oxide ($Al_2O_3$); etc. As noted, the hydrides may include, for example, silane ($SiH_4$) or disilane ($Si_2H_6$). In this case, metal oxide media section 112 converts the hydrides to silicon oxide ($SiO_2$) and water ($H_2O$). Some illustrative chemical reactions in metal oxide media section 112 may include:

$$SiH_4 + 4CuO \rightarrow SiO_2 + 2H_2O + 4Cu \quad (1)$$

$$Si_2H_6 + 7CuO \rightarrow 2SiO_2 + 3H_2O + 7Cu \quad (2)$$

The sections also include a desiccate media section 114 downstream to metal oxide media section 112. Desiccate media section 114 removes moisture, i.e., water ($H_2O$), from emission stream 102, which is produced by metal oxide media section 112. Desiccate media section 114 may include any now known or later developed desiccate media/material 136, i.e., a desiccant. That is, it may include any hygroscopic substance that allows a gas to pass therethrough. In certain embodiment, desiccate media 136 includes silicon oxide ($SiO_2$) (i.e., silica). Silicon oxide media may take any now known or later developed form such as but not limited to silica gel or granular silica. Other desiccate media 136 may include but are not limited to activated charcoal, calcium sulfate or calcium chloride may also be used.

A particulate filter 140 may optionally be positioned upstream of desiccate media section 114, i.e., between metal oxide media section 112 and desiccate media section 114. Particulate filter 140 may include any now known or later developed filter media to prevent passage of unwanted or excessive particulate such as but not limited to silicon oxide (SiO$_2$) or other particulate formed by processing in metal oxide media section 112. Housing 130 of metal oxide media section 112 and/or desiccate media section 114 may include an opening (not labeled) in the side thereof to allow replacement or other maintenance of particulate filter 140.

Periodically it may be necessary to remove moisture, i.e., water (H$_2$O), from desiccate media section 114, for example, when a moisture absorption limit of desiccate media 136 has been reached. The moisture removal may 'regenerate' desiccate media 136. To this end, a heater 144 may be thermally coupled to and configured to remove moisture from desiccate media section 114 during an inoperative state of system 100. The inoperative state of system 100 is when emission stream 102 is not being transmitted through metal oxide media section 112, desiccate media section 114 and catalytic media section 116. During operation of heater 144 moisture evaporates from desiccate media 136, i.e., it is released therefrom, and passes through catalytic media section 116, e.g., by force of vacuum pump 120. Heater 144 can take any form of an electric heater and may be structured with housing 130 of desiccate media section 114 in any manner, e.g., surrounding or otherwise thermally contacting housing 130, to thermally communicate with desiccate media 136. Heater 144 could also include a fuel burning heater, but this is not ideal due to the additional pollutants generated. In one non-limiting example, when heater 144 is off, desiccate media section 114 has a temperature of less than 75 °Celsius (° C.). When on, in one non-limiting example, heater 144 may be capable of applying heat in a range of 120 to 200° C. In another non-limiting example, heater 144 may be capable of applying heat in a range of 150 to 250° C. Heater 144 is shown operatively coupled to controller 122, operation of which will be described herein. Although not shown, an inert gas, such as nitrogen (N$_2$) or clean dry air, may be directed through system 100 during an inoperative state as described herein, e.g., by vacuum pump 120, to transfer any released gases through system 100 and further lower the humidity to desired operating conditions.

Figure 2:
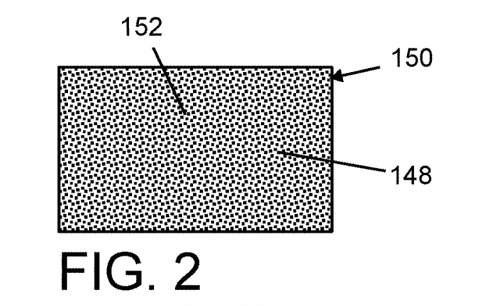
FIG. 2 shows a schematic view of a catalytic media for abatement of an emission stream from a semiconductor manufacturing process, according to embodiments of the disclosure.
Figure 3:
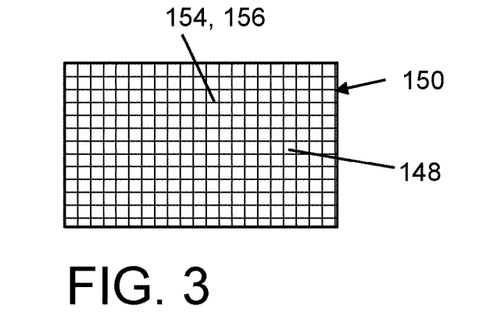
FIG. 3 shows a schematic view of a catalytic media for abatement of an emission stream from a semiconductor manufacturing process, according to other embodiments of the disclosure.
Figure 4:
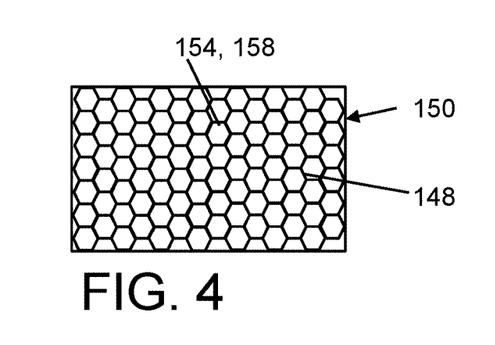
FIG. 4 shows a schematic view of a catalytic media for abatement of an emission stream from a semiconductor manufacturing process, according to yet other embodiments of the disclosure.

The sections also include a catalytic media section 116 downstream to desiccate media section 114. Catalytic media section 116 includes a dry catalytic media 148 that is a reactive and/or absorbent media, or combination of reactive and/or absorbent medias, capable of catalyzing one or more chemical reactions to abate emission stream 102. In the instant case, catalytic media 148 removes a nitrogen oxide (NO$_x$), such as nitrous oxide (N$_2$O), from emission stream 102. More particularly, as shown in FIGS. 2-4, catalytic media 148 of catalytic media section 116 includes a substrate 150 including at least one platinum group metal such as palladium (Pd), platinum (Pt), rhodium (Rh), etc. In this case, platinum (Pt) and rhodium (Rh) on a surface is used as an example. Substrate 150 can take a variety of forms to provide the desired surface area to interact with emission stream 102. In certain embodiments, as shown in FIG. 2, substrate 150 includes a granular media 152. In other embodiments, as shown in FIGS. 3-4, substrate 150 includes a honeycomb structure 154. FIG. 3 shows a square honeycomb structure 156, and FIG. 4 shows a hexagonal honeycomb structure 158. Other forms of honeycomb structure 154 are also possible.

Figure 5:
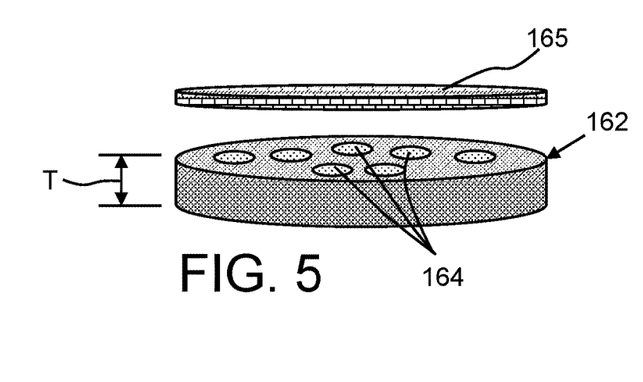
FIG. 5 shows a perspective view of a porous ceramic insulating layer for a system of abatement of an emission stream from a semiconductor manufacturing process, according to embodiments of the disclosure.

Returning to FIG. 1, system 100 may also include a heater 160 thermally coupled to and configured to heat at least a section of catalytic media section 116 to increase the chemical reaction occurring therein. Heater 160 can take any form of an electric heater and may be structured with housing 130 of catalytic media section 116 in any manner, e.g., surrounding or otherwise thermally contacting housing 130, to thermally communicate with catalytic media 148. Heater 160 could also include a fuel burning heater, but this is not ideal due to the additional pollutants generated. When on, in one non-limiting example, heater 160 may be capable of applying heat in a range of 200 to 600° C. In certain embodiments, a porous ceramic insulating layer 162 may be positioned between desiccate media section 114 and catalytic media section 116 to retain heat from heater 160 in catalytic media section 116 and prevent degradation of desiccate media 136 in desiccate media section 114. FIG. 5 shows a perspective view of porous ceramic insulating layer 162. Porous ceramic insulating layer 162 may include, for example, an alumina refractory ceramic, and may have any thickness T sufficient to provide the desired thermal insulating factor. In one non-limiting example, thickness T may be between 3 and 6 centimeters. Layer 162 may include any number of pass-through holes 164 sufficient to allow emission stream 102 to pass therethrough at the desired flow rate, volume, etc. As also shown in FIG. 5, a mesh layer 165 may be optionally positioned over layer 162 to prevent desiccate media 134 from falling through pass-through holes 164. Mesh layer 165 may have any configuration such as size wire, opening size or shape, etc., to prevent passage of desiccate media 134 through pass-through holes 164. The configuration of mesh layer 165 will depend on the physical characteristics of desiccate media 134, e.g., size.

Returning to FIG. 1, in certain embodiments, system 100 may also include a temperature sensor 166 operatively coupled to catalytic media section 116. Temperature sensor 166 may include any form of temperature measuring device capable of withstanding the environmental conditions within catalytic media section 116. Temperature sensor 166 may include, for example, a thermometer, a thermocouple or other temperature measuring device. System 100 may also include a heater control 168 configured to control heater 160 based on a temperature measured by temperature sensor 166. Heater control 168 may include any computing device, or combination of computing devices, capable of receiving and transmitting electrical signals to observe, operate, or otherwise engage heater 160 and components thereof. Heater control 168 may also optionally communicate with external devices over a network, such as a wide area network (WAN) and/or local area network (LAN). In some implementations, an external computing device may communicate with heater control 168 to exchange information about heater 160 operating conditions, etc. In some implementations, an external computing device may transmit electrical signals to heater control 168 that correspond to commands for operating heater 160. In some implementations, the external computing device provides a graphical user interface (GUI), which enables a user to observe, operate, or otherwise engage heater 160 through the external computing device. Heater 160 is shown operatively coupled to heater control 168, but could alternatively, or in addition thereto, be operatively coupled to a more general-purpose controller 122 for system 100, operation of which will be described herein.

Figure 6A:
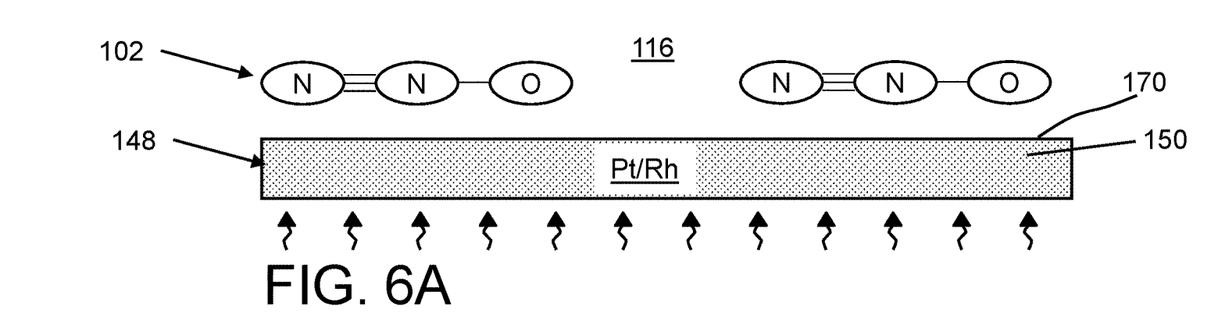
FIGS. 6A-C show schematic views of a chemical reaction of a catalytic media section for a system of abatement of an emission stream from a semiconductor manufacturing process, according to embodiments of the disclosure.
Figure 6B:
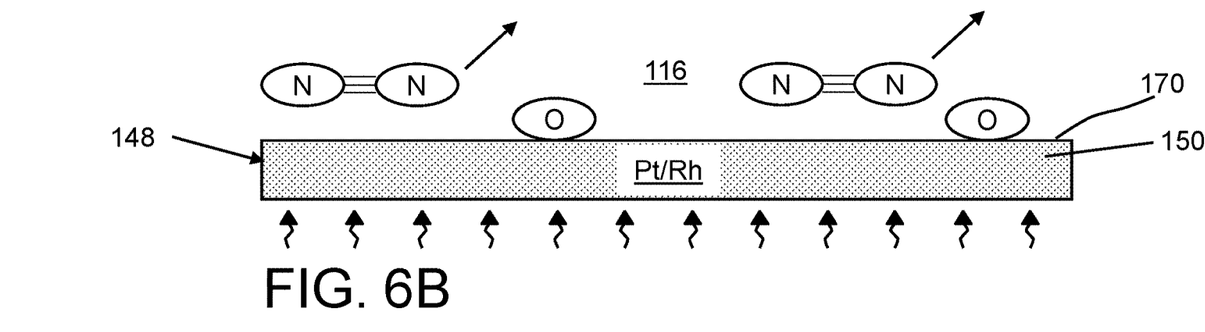
Figure 6C:
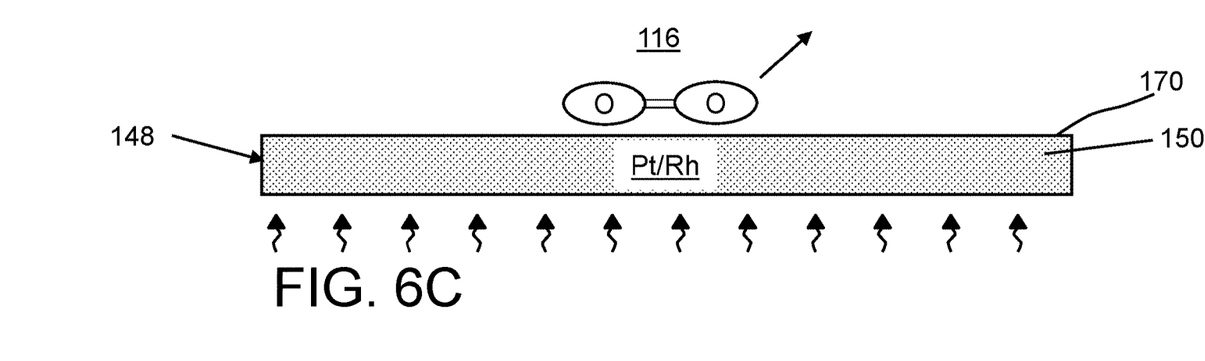

FIGS. 6A-C schematically show the chemical reaction in catalytic media section 116. FIG. 6A shows emission stream 102 including nitrogen oxide (NO$_x$) in the form of nitrous oxide (N$_2$O) entering catalytic media section 116. Catalytic media 148 is shown as a single flat surface with a platinum group metal, such as palladium, platinum and/or rhodium (referenced as "Pt/Rh" in drawings) on a surface 170 of substrate 150 for simplicity; it is understood that it can take any of the forms described herein. As shown in FIG. 6B, the chemical reaction in catalytic media section 116 includes monoatomic oxygen (O) from nitrogen oxide ($NO_x$) separating from the two nitrogen atoms ($N_2$) and bonding with the at least one platinum group metal, e.g., palladium (Pd), platinum (Pt) and/or rhodium (Rh), of catalytic media 148, i.e., on surface 170 of substrate 150. The nitrogen gas ($N_2$) then flows away (see arrows) through an outlet 172 (FIG. 1, not shown in FIG. 6B) of catalytic media section 116 and system 100, i.e., as part of an abated emission stream 102X. As shown in FIG. 6C, monoatomic oxygen (O) reacts with other monoatomic oxygen (O) at surface 170 of catalytic media 148 to create singlet oxygen ($O_2$). Once singlet oxygen ($O_2$) is formed, the bonds with the platinum group metal(s), e.g., platinum (Pt) and/or rhodium (Rh), on surface 170 of substrate 150 are broken, and the singlet oxygen ($O_2$) flows away (see arrows) through outlet 172 (FIG. 1) of catalytic media section 116, i.e., as part of abated emission stream 102X. The curved arrows under substrate 150 indicate heat optionally applied by heater 160 (FIG. 1) to accelerate the reaction to remove more nitrogen oxide ($NO_x$). As noted, when on, in one non-limiting example, heater 160 may be capable of applying heat in a range of 300 to 400° C. to accelerate the reaction to remove more nitrogen oxide ($NO_x$) in catalytic media section 116.

In certain embodiments, system 100 may also include at least one sensor 176 (in drawings labeled 176P and/or 176O) operatively coupled to at least one part of system 100. In this setting, sensor(s) 176 are coupled to or coupled relative to at least one of sections 112, 114, 116 of system 100. Sensor(s) 176 may also include temperature sensor 166, as described herein. Sensor(s) 176 may be operatively coupled to parts of system 100 and configured to detect an abatement fault, i.e., an inoperative state or diminished state of operation of the part. Sensor(s) 176 may include any sensor, or combination of sensors, configured to detect faults in system 100 due to a measurable variation in operating conditions of system 100. Sensor(s) 176 may include temperature sensors, pressure sensors, flow rate meter sensors, gas sensor, or a combination of these sensors. In some implementations, sensor(s) 176 include a pressure sensor (transducer) 176P and an oxygen sensor 176O. Oxygen sensor(s) 176O may include, for example, amperometric oxygen sensor, tunable diode laser (TDL) spectrometer, etc., to measure concentration of oxygen species in emission stream 102. For instance, oxygen sensor 176O may include an amperometric oxygen sensor which measures a concentration of oxygen in emission stream 102 flowing into metal oxide media section 112 and/or out catalytic media section 116. In some implementations, sensor(s) 176 include a plurality of sensors that collectively measure a plurality of attributes of emission stream 102, system 100, operating conditions, etc. Moreover, sensor(s) 176 may transmit sensor signals indicating respective measurements to controller 122 or heater control 168 in system 100. The type of fault detected can vary depending on the type of sensor 176 used, e.g., pressure too low or too high may be indicated by a pressure sensor 176P; too little or too much oxygen may be indicated by oxygen sensor 176O; or too little flow by a flow sensor (not shown).

System 100 may further include a controller 122 operatively coupled to sensor(s) 176, vacuum pump 120, and bypass valve 124. In certain embodiments, controller 122 is configured to perform at least one of: close bypass valve 124 to direct emission stream 102 to alternative abatement system 126 and/or turn off vacuum pump 120 to shut down system 100, in response to a measurement of sensor(s) 176 indicating a fault. Controller 122 may receive sensor signals from sensor(s) 176 (and 166) indicating detection of the fault in system 100, and in turn actuate bypass valve 124 and/or deactivate semi process 104, in response to said sensor signals. Controller 122 may include any computing device, or combination of computing devices, capable of receiving and transmitting electrical signals to observe, operate, or otherwise engage system 100 and components thereof. Controller 122 may communicate with external devices over a network, such as a wide area network (WAN) and/or local area network (LAN). In some implementations, an external computing device may communicate with controller 122 to exchange information about system 100, operating conditions, etc. In some implementations, an external computing device may transmit electrical signals to controller 122 that correspond to commands for operating system 100. In some implementations, the external computing device provides a graphical user interface (GUI), which enables a user to observe, operate, or otherwise engage system 100 through the external computing device.

In operation, a method according to embodiments of the disclosure may include transmitting emission stream 102 from semiconductor manufacturing process 104 sequentially through plurality of abatement sections 112, 114, 116. As noted, the sections include metal oxide media section 112 to remove a hydride from emission stream 102, desiccate media section 114 downstream to metal oxide media section 112 to remove moisture from emission stream 102, and catalytic media section 116 downstream to desiccate media section 114 to remove a nitrogen oxide ($NO_x$) from emission stream 102. As noted, the method may also include heating catalytic media section 116 during the transmitting, i.e., using heater 160.

In addition, during operation, controller 122 may monitor operation via sensor(s) 176 for an abatement fault which may occur in system 100, decreasing abatement performance and/or possibly rendering system 100 inoperable. System 100 according to the disclosure is operable to transmit emission stream 102 to another location, i.e., alternative abatement system 126, instead of system 100 in response to detecting the abatement fault or shutting down system 100. System 100 may include bypass valve 124 configured to fluidly couple emission stream 102 to alternative abatement system 126 in response to the abatement fault, and/or deactivate vacuum pump 120 to shut down system 100. In some implementations, bypass valve 124 includes a manual valve to fluidly couple emission stream 102 to alternative abatement system 126 in response to the abatement fault. In other implementations, an external device may transmit electrical signals to operate bypass valve 124 and/or vacuum pump 120, as discussed herein.

After abated emission stream 102X reaches outlet 172 of system 100, it is free of hydrides and nitrogen oxide ($NO_x$) and may continue to additional abatement systems (not shown) or be released to atmosphere.

Embodiments of the disclosure provide various technical and commercial advantages, examples of which are discussed herein. The abatement system provides carbon-free abatement of nitrogen oxide and hydride(s). The abatement system has significantly lower cost to operate compared to conventional burner and wet scrubbing systems that include a combustion burner to burn fossil fuels, e.g., natural gas, and a wet scrubber that uses large amounts of water. The abatement system also has lower manufacturing costs and can be incorporated with other existing abatements systems for semiconductor manufacturing processes that do not use hydrides, saving floor space.

The terminology used herein is for the purpose of describing particular embodiments only and is not intended to be limiting of the disclosure. As used herein, reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed. It will be further understood that the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not. It will be further understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An abatement system for a semiconductor manufacturing process, the system comprising:
   a plurality of sections configured to pass an emission stream from the semiconductor manufacturing process therethrough, the plurality of sections including:
   a metal oxide media section to remove a hydride from the emission stream;
   a desiccate media section downstream to the metal oxide media section to remove moisture from the emission stream; and
   a catalytic media section downstream to the desiccate media section to remove a nitrogen oxide ($NO_x$) from the emission stream.

2. The abatement system of claim 1, further comprising a heater thermally coupled to and configured to heat the catalytic media section during operation thereof.

3. The abatement system of claim 2, further comprising a porous ceramic insulating layer between the desiccate media section and the catalytic media section, the porous ceramic insulating layer having a plurality of pass-through holes therein, and further comprising a mesh layer over the porous ceramic insulating layer.

4. The abatement system of claim 2, further comprising a temperature sensor operatively coupled to the catalytic media section, and a heater control configured to control the heater based on a temperature measured by the temperature sensor.

5. The abatement system of claim 1, wherein the catalytic media section includes a substrate including at least one platinum group metal.

6. The abatement system of claim 5, wherein the substrate includes one of a granular media and a honeycomb structure.

7. The abatement system of claim 1, further comprising a heater thermally coupled to and configured to heat at least a section of the catalytic media section.

8. The abatement system of claim 1, further comprising a particulate filter upstream of the desiccate media section.

9. The abatement system of claim 1, wherein the desiccate media section includes a silicon oxide ($SiO_2$) media therein.

10. The abatement system of claim 1, further comprising a heater thermally coupled to and configured to remove moisture from the desiccate media section during an inoperative state of the metal oxide media section, the desiccate media section and the catalytic media section.

11. The abatement system of claim 1, further comprising a chemical vapor deposition (CVD) chamber for a semiconductor manufacturing process upstream of the metal oxide media section.

12. The abatement system of claim 1, further comprising a vacuum pump coupled to the plurality of sections and configured to transmit the emission stream from the semiconductor manufacturing process through the plurality of sections.

13. The abatement system of claim 1, further comprising:
an exhaust input from the semiconductor manufacturing process to the metal oxide media section;
a bypass valve upstream of the exhaust input;
a vacuum pump coupled to the plurality of sections and configured to transmit the emission stream from the semiconductor manufacturing process through the plurality of sections;
at least one sensor operatively coupled to at least one of the metal oxide media section and the catalytic media section, the at least one sensor selected from a group comprising a pressure sensor and an oxygen sensor; and
a controller configured to perform at least one of: close the bypass valve or turn off the vacuum pump, in response to a measurement of the at least one sensor indicating a fault.

14. An abatement system for a chemical vapor deposition (CVD) chamber for a semiconductor manufacturing process, the abatement system comprising:
a plurality of sections configured to pass an emission stream from the semiconductor manufacturing process therethrough, the plurality of sections including:
a metal oxide media section to remove a hydride from the emission stream;
a desiccate media section downstream to the metal oxide media section to remove moisture from the emission stream; and
a catalytic media section downstream to the desiccate media section to remove a nitrogen oxide ($NO_x$) from the emission stream; and
a vacuum pump coupled to the plurality of sections and configured to transmit the emission stream from the semiconductor manufacturing process through the plurality of sections.

15. The abatement system of claim 14, further comprising:
a heater thermally coupled to and configured to heat the catalytic media section during operation thereof;
a temperature sensor operatively coupled to the catalytic media section; and
a heater control configured to control the heater based on a temperature measured by the temperature sensor.

16. The abatement system of claim 14, further comprising a porous ceramic insulating layer between the desiccate media section and the catalytic media section, the porous ceramic insulating layer having a plurality of pass-through holes therein, and further comprising a mesh layer over the porous ceramic insulating layer.

17. The abatement system of claim 14, further comprising a particulate filter upstream of the desiccate media section.

18. The abatement system of claim 14, further comprising a heater thermally coupled to and configured to remove moisture from the desiccate media section during an inoperative state of the metal oxide media section, the desiccate media section and the catalytic media section.

19. The abatement system of claim 14, further comprising:
an exhaust input from the CVD chamber to the metal oxide media section;
a bypass valve upstream of the exhaust input;
at least one sensor operatively coupled to at least one of the metal oxide media section and the catalytic media section, the at least one sensor selected from a group comprising a pressure sensor and an oxygen sensor; and
a controller configured to perform at least one: close the bypass valve or turn off the vacuum pump, in response to a measurement of the at least one sensor indicating a fault.

20. A method, comprising:
transmitting an emission stream from a semiconductor manufacturing process sequentially through a plurality of abatement sections including:
a metal oxide media section to remove a hydride from the emission stream;
a desiccate media section downstream to the metal oxide media section to remove moisture from the emission stream; and
a catalytic media section downstream to the desiccate media section to remove a nitrogen oxide ($NO_x$) from the emission stream; and
heating the catalytic media section during the transmitting.

* * * * *